US007811855B2

(12) United States Patent
Pitault

(10) Patent No.: US 7,811,855 B2
(45) Date of Patent: Oct. 12, 2010

(54) METHOD FOR PRODUCING A MATRIX FOR DETECTING ELECTROMAGNETIC RADIATION AND METHOD FOR REPLACING AN ELEMENTARY MODULE OF SUCH A DETECTION MATRIX

(75) Inventor: Bernard Pitault, Saint Etienne De Crossey (FR)

(73) Assignee: Societe Francaise de Detecteurs Infrarouges-Sofradir, Chatenay Malabry (FR)

( * ) Notice: Subject to any disclaimer, the term of this patent is extended or adjusted under 35 U.S.C. 154(b) by 197 days.

(21) Appl. No.: 12/144,991

(22) Filed: Jun. 24, 2008

(65) Prior Publication Data

US 2009/0004760 A1    Jan. 1, 2009

(30) Foreign Application Priority Data

Jun. 27, 2007   (FR)  ................................... 07 56069

(51) Int. Cl.
*H01L 21/44* (2006.01)
*H01L 23/48* (2006.01)
*B23K 31/00* (2006.01)

(52) U.S. Cl. .................. 438/108; 438/613; 228/180.22; 257/738; 257/779; 257/780; 257/786; 257/E23.021

(58) Field of Classification Search ........................ None
See application file for complete search history.

(56) References Cited

U.S. PATENT DOCUMENTS

| 5,186,383 | A | 2/1993 | Melton et al. |
|---|---|---|---|
| 5,552,596 | A | 9/1996 | Ravetto et al. |
| 6,175,157 | B1 | 1/2001 | Morifuji |
| 6,222,277 | B1 * | 4/2001 | Downes ........................ 257/778 |
| 6,443,351 | B1 * | 9/2002 | Huang et al. .................. 228/103 |

(Continued)

FOREIGN PATENT DOCUMENTS

DE    30 42 085 A1    6/1981

(Continued)

OTHER PUBLICATIONS

Puttlitz Sr, K.J., "*An Overview of Flip-Chip Replacement Technology on MLC Multichip Modules*," International Journal of Microcircuits and Electronic Packaging, The International Society for Hybrid Microelectronics, vol. 15, No. 3, Third Quarter 1992, Reston, VA, pp. 113-126.

*Primary Examiner*—Alonzo Chambliss
(74) *Attorney, Agent, or Firm*—Burr & Brown

(57) ABSTRACT

A method for producing a matrix of electromagnetic radiation detectors made up of a plurality of elementary detection modules mounted on an interconnection substrate. The method includes depositing on the interconnection substrate a predefined number of quantities of solder or hybridization material, intended to constitute hybridization bumps for the elementary modules, in at least a first array for the nominal hybridization, and at least one second array, with the deposits of solder or hybridization material of the second array being lower in volume than those of the first array, depositing a liquid flux on the interconnection substrate, mounting the elementary modules to be hybridized on the interconnection substrate, and raising the temperature of a chamber in which the various elements to be hybridized are positioned until reaching at least the melting point of the solder or hybridization material to join the modules and interconnection substrate together by reflow effect.

6 Claims, 4 Drawing Sheets

U.S. PATENT DOCUMENTS

| | | |
|---|---|---|
| 6,650,016 B1 * | 11/2003 | MacQuarrie et al. ........ 257/738 |
| 7,714,452 B2 * | 5/2010 | Clevenger et al. ........... 257/786 |
| 2003/0060035 A1 | 3/2003 | Kimura et al. |
| 2006/0202318 A1 | 9/2006 | Satou et al. |
| 2008/0003805 A1 * | 1/2008 | Pang et al. ................. 438/613 |
| 2009/0321013 A1 * | 12/2009 | Pitault ........................ 156/305 |

FOREIGN PATENT DOCUMENTS

| | | |
|---|---|---|
| DE | 197 38 399 A1 | 3/1999 |
| EP | 0 665 594 A1 | 8/1995 |
| GB | 2 062 963 A1 | 5/1981 |

* cited by examiner

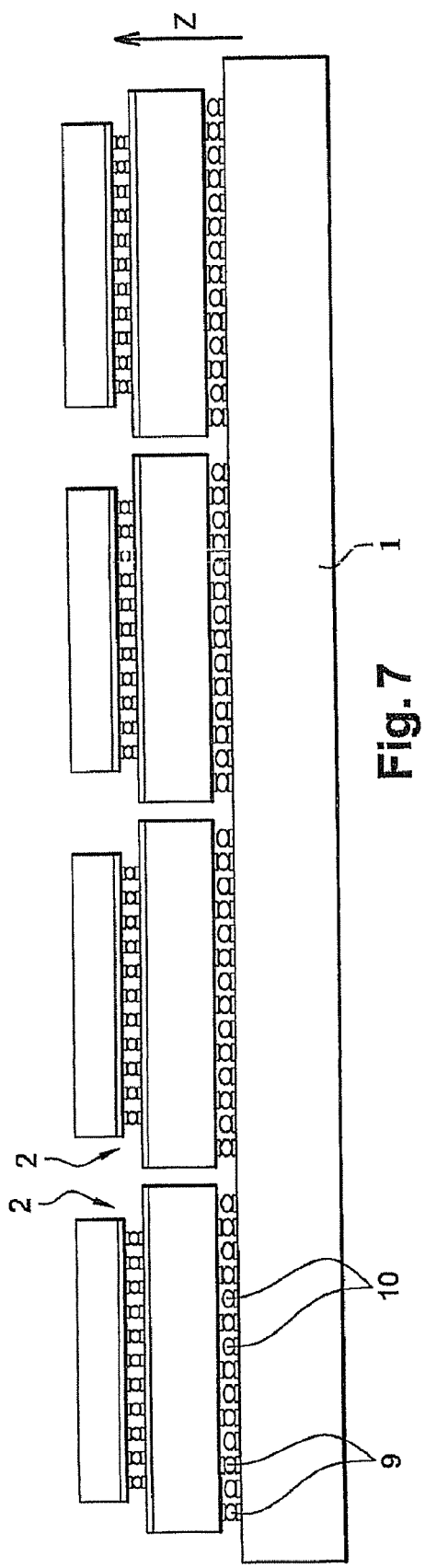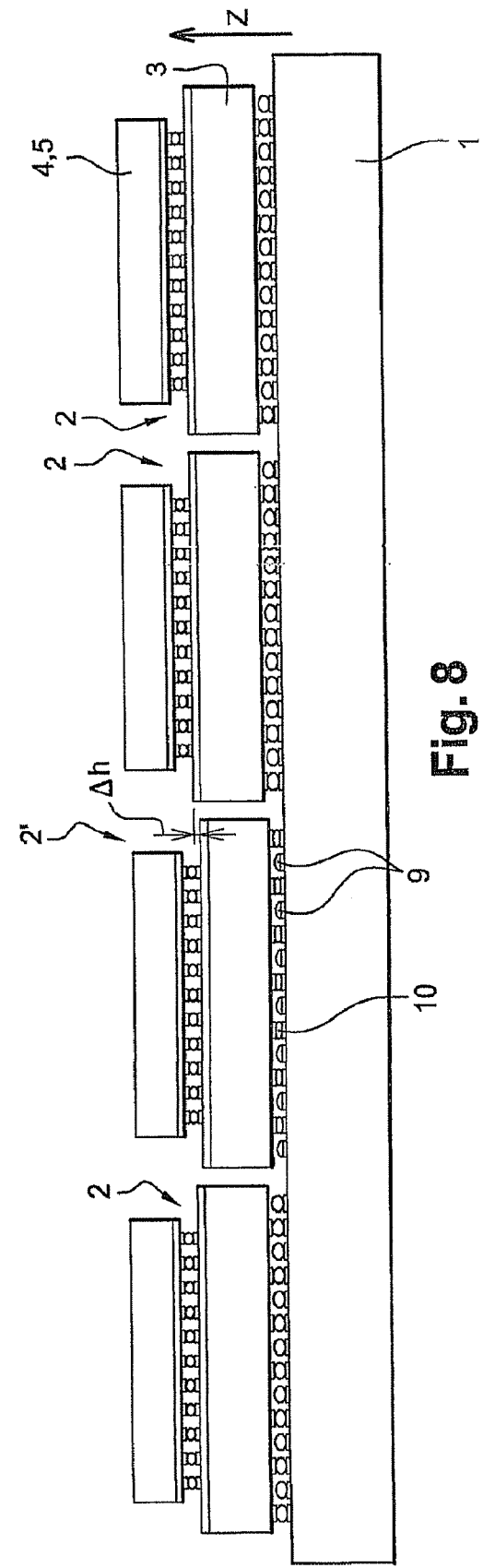

METHOD FOR PRODUCING A MATRIX FOR DETECTING ELECTROMAGNETIC RADIATION AND METHOD FOR REPLACING AN ELEMENTARY MODULE OF SUCH A DETECTION MATRIX

FIELD OF THE INVENTION

The present invention relates to the field of electromagnetic radiation detectors, and in particular the field of the infrared and visible spectrum. It relates more particularly to the production of very large focal planes, typically greater than 100 mm, and especially their repair.

BACKGROUND OF THE INVENTION

Electromagnetic radiation detectors conventionally consist of a circuit for detecting said waves to be detected, and are therefore sensitive to the corresponding wavelength range, converting an electromagnetic signal to an electrical signal in a manner known per se. This detection circuit is associated with an electronic read circuit, intended to convert the electrical signals issuing from the detection circuit to make them suitable for undergoing a subsequent processing, particularly after amplification.

Also in a manner known per se, the mechanical and electrical connection between the detection circuit and the read circuit takes place by the technology called hybridization by bumps or microbumps, also referred to as "*Flip Chip*". These bumps or microbumps are made from indium, or even from tin/lead alloy.

The detection circuit conventionally comprises a material that is transparent to or a poor absorber of the radiation to be detected, and consists for example of CdTe, CdZnTe, or even germanium, on which a thin absorbent layer of HgCdTe constituting the actual detection circuit is deposited by epitaxy (in liquid phase, vapor phase, or by molecular jet).

The read circuit is usually made from silicon.

These various technologies are fully controlled today.

However, the developments observed in the field of detection, and more particularly in the space field, require the use of very large focal planes, typically larger than 100 millimeters. Concerning the actual detection element, this demands the use of several elementary detection modules joined to one another or placed in a staggered arrangement. In fact, such detection systems have a number of requirements associated in particular with the focusing, the reconstitution of a very large detection array . . . , which accordingly impose limitations on the relative positioning of the various elementary modules, on the one hand in the two dimensions of the plane in which they are inscribed (sides X, Y), and on the other, on the dispersion along side Z, that is in the direction perpendicular to the plane of the various diodes constituting the focal plane.

Among these technical solutions proposed so far, the earliest proposed the mechanical attachment of the various elementary modules constituting the focal plane by screwing or clamping to the interconnection array or substrate. FIG. 1 shows an illustration of this technology. Numeral 1 indicates the interconnection substrate and numeral 2 the various elementary modules mounted in a staggered arrangement, which constitute the detection array.

Each of these modules 2 comprises a read circuit 3, and in the example described two detection circuits 4, 5 correspond to two different wavelength ranges. Each of these modules 2 is bonded to a transfer pad 6, typically made from molybdenum, since the screwing or clamping 7 cannot be carried out directly on the read circuit.

Also proposed (see FIG. 2) was a mechanical maintenance of the various elementary modules by bonding. According to this technology, each of the elementary modules 2 is positioned on the interconnection array or substrate 1, and is maintained in position by polymerization of a bed of adhesive deposited between the read circuit 3 and said interconnection substrate.

Also proposed (see FIG. 3), was a mode for attaching the elementary modules 2 to the interconnection substrate 1 by hybridization, that also uses the "*Flip chip*" technology.

In this case, the position maintenance can be reinforced by curing of an adhesive that can be caused to migrate between the read circuit 3 and the interconnection circuit 1 (underfilling)—this can only constitute an optional reinforcement of the position maintenance.

Regardless of the technology employed, a difficulty arises when it is observed that one or more of the detectors no longer supply the required performance, particularly due to an accidental degradation, or even when a change in performance of one or more elementary modules is observed between the sorting phase of said modules and the test phase after final mounting on the interconnection substrate.

In fact, the replacement of such a defective elementary module must not affect the adjacent modules. Moreover, the installation of a new module must meet the requisite electro-optical specifications.

Finally, the geometric specifications must be preserved after the replacement of such an elementary module, in particular for the final focal plane, the X, Y and Z positioning of the photosites.

No method is available today for replacing a defective elementary module in this way. It is the object of the present invention to propose such a method.

SUMMARY OF THE INVENTION

The present invention relates first to a method for producing a matrix of electromagnetic radiation detectors. This matrix consists of a plurality of elementary detection modules mounted on an interconnection substrate, said elementary modules themselves comprising at least one circuit for detecting said radiation associated with a hybridization read circuit, said read circuit being itself joined to the interconnection substrate by hybridization.

According to the invention, this method preferably includes:

depositing on the interconnection substrate a predefined number of quantities of solder or hybridization material, intended to constitute the hybridization bumps, and in at least two arrays, at least the array used for nominal hybridization being connected to interconnection pins via conducting metal tracks, the deposits of solder or hybridization material of said second array or arrays being lower in volume than those of said first array; in depositing a soldering material on the interconnection substrate thereby provided with at least two arrays, a flux of material in liquid form performing the functions of deoxidation of said solder or hybridization material, of limiting the reoxidation of said material after effective completion of said soldering, of heat transfer, in addition to decreasing the surface tension;

mounting the elementary modules to be hybridized on the interconnection substrate;

then raising the temperature of the chamber in which the various elements to be hybridized are positioned until reaching at least the melting point of the solder or hybridization material in order to complete the effective soldering or hybridization of the modules to the interconnection substrate together by reflow effect.

In other words, the invention preferably includes arranging at least two arrays of different elements suitable for carrying out the hybridization of the elementary modules on the interconnection substrate:

a first array, intended conventionally for the "nominal" hybridization of the elementary module or modules on the interconnection substrate;

and at least one second array, of smaller dimensions, and in particular having a lower volume and hence lower height than the first array, so as not to come into contact with the elementary module or modules during the carrying out of the nominal hybridization, and intended, after optional replacement of a defective elementary module or one not meeting the required recommendations, to nevertheless permit a new hybridization of a replacement elementary module.

The invention therefore also relates to a method for replacing an elementary detection module mounted by hybridization on an interconnection substrate comprising a plurality of such elementary modules juxtaposed or joined together side by side in order to define a large focal plane. These elementary modules are mounted on the interconnection substrate by a first array of hybridization bumps, made in particular from indium or from tin/lead alloy, the bumps being connected to one or more external connection pins by one or more conducting tracks. The interconnection substrate also comprises at least one second array of hybridization bumps, having lower dimension than those of the bumps of the first hybridization array.

This method preferably includes:

first, removing the protective layer applied to the external connection pin or pins that are electrically connected to the first array of hybridization bumps, called nominal hybridization;

then causing to migrate, in particular by capillarity, an electrically conducting solution between the elementary module to be replaced and the interconnection substrate, in order to cause, by electrochemical reaction, the at least partial dissolution of the first array of hybridization bumps;

thereby removing the module to be replaced;

then hybridizing the replacement module by a new temperature rise of the chamber in which the assembly is located to a temperature at least equal to the melting point of the material constituting the hybridization bumps of the second array, thereby joining them by reflow.

Advantageously, the replacement module comprises a detection (or read) circuit that is thicker than the detection (or read) circuit of the replaced module, in order to compensate for the variation in height of the hybridization bumps between the two arrays.

Furthermore, according to an alternative embodiment of the invention, the electrically conducting solution is deposited on the back of the elementary module to be replaced.

BRIEF DESCRIPTION OF THE DRAWINGS

The manner in which the invention can be implemented and the advantages thereof will appear more clearly from the exemplary embodiment that follows, provided for indication and nonlimiting, in conjunction with the appended figures.

FIG. 7 is a schematic representation in a section of a nominal focal plane, that is only comprising the original elementary modules.

FIG. 8 is a schematic representation in the section of a focal plane after replacement of an elementary module according to the method of the invention.

DETAILED DESCRIPTION OF THE INVENTION

Figure 1:
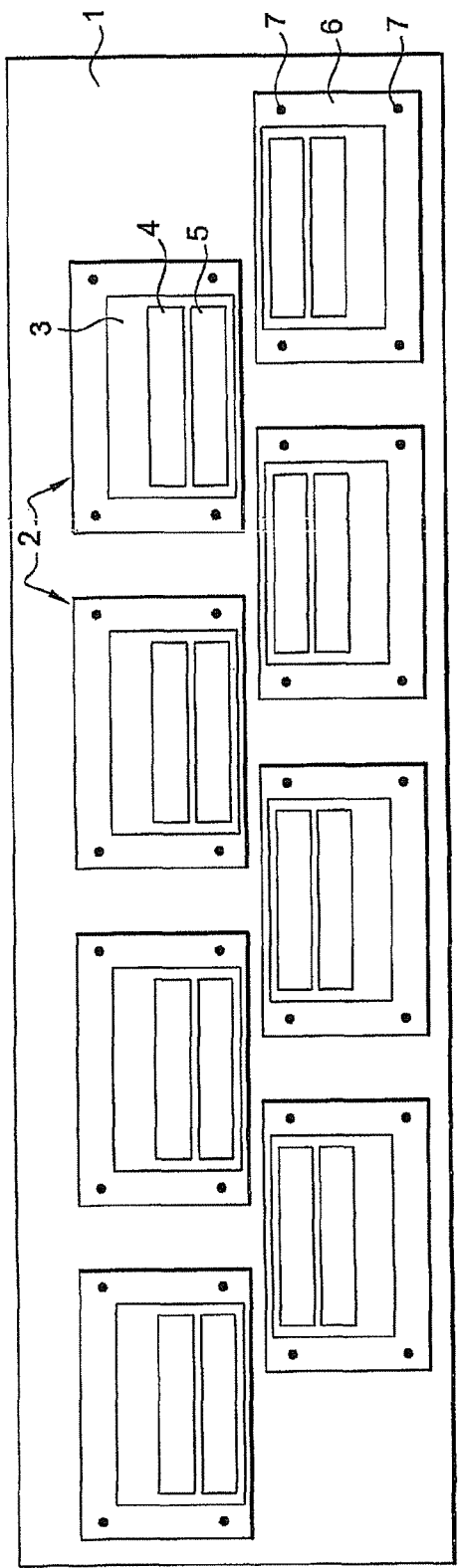
FIG. 1 is a schematic plan view of a prior art technology using mechanical clamping or screwing of the elementary modules to the interconnection substrate.
Figure 2:
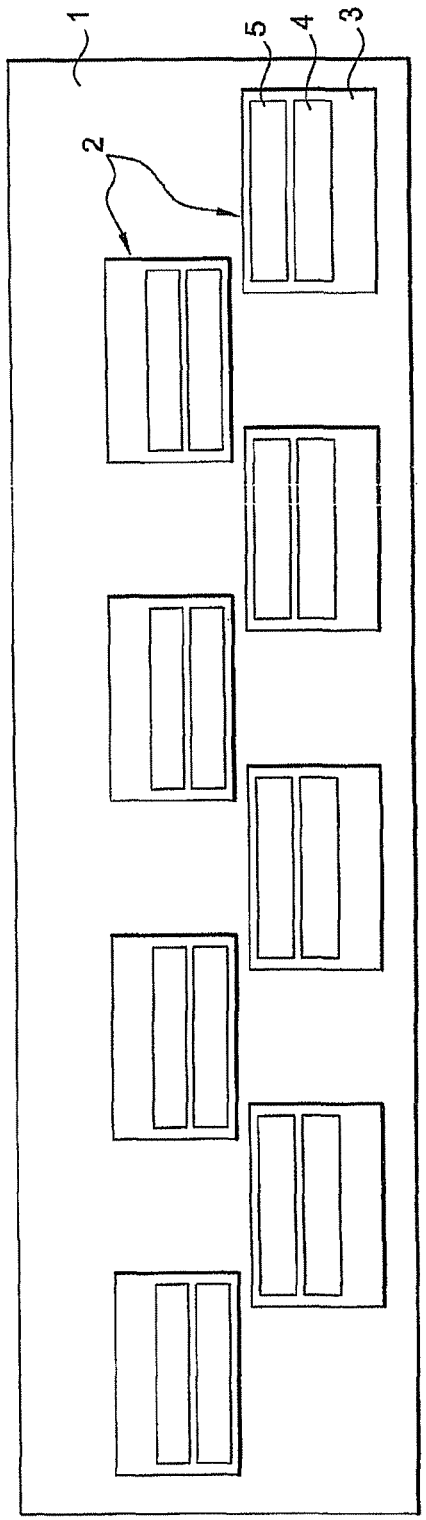
FIG. 2, also already described, is a schematic representation of the prior art technology in a plan view, employing the technology of bonding the elementary modules to the indexation substrate.
Figure 3:
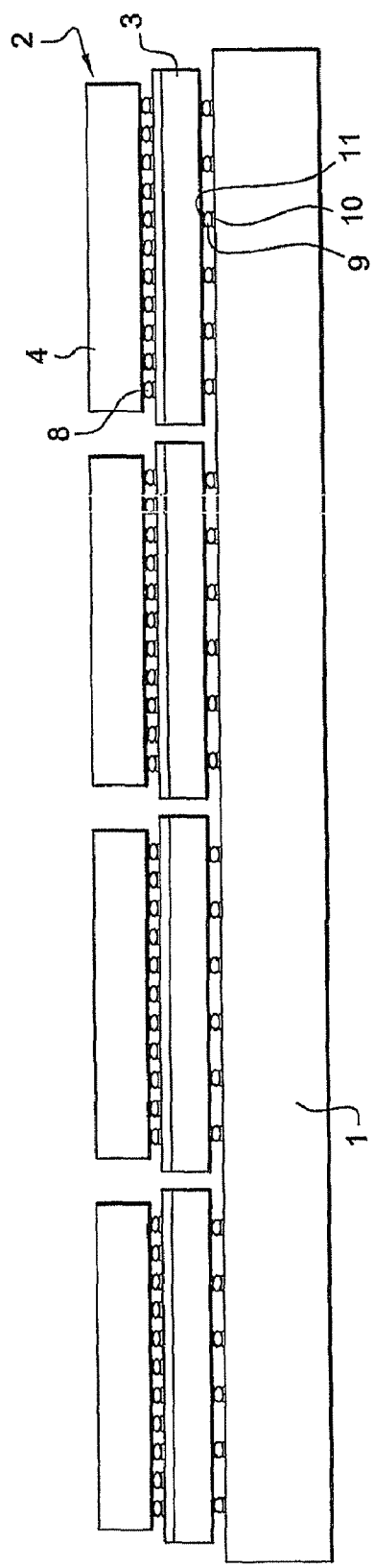
FIG. 3 is a schematic view in a longitudinal section of another prior art technology, employing the hybridization of the elementary modules on the interconnection substrate.

The elementary detection modules according to the invention are prepared as follows, with the reminder that in the general view of the present invention, it is possible to hybridize a plurality of detection circuits 4, 5 on the same read circuit 3, according to the number of wavelength ranges that the final detector is intended to detect.

This detection circuit 4 consists, for example, of a first layer of material transparent to infrared radiation, having a typical thickness of between 200 and 800 µm, for example consisting of CdTe or CdZnTe. A second thinner layer of HgCdTe 4' constituting the actual detection layer is deposited on this first layer by molecular jet epitaxy for example. Said actual detection layer is therefore placed on the front of the detection circuit. In the present case, this is a backlit device.

The read circuit 3 consists of a stack of thinned silicon 3' constituting the front of the read circuit on a thicker layer of germanium. The rigid connection between these two materials is provided either by epoxy adhesive or by molecular adhesion, and in a manner known per se.

Simultaneously and in a manner known per se, in order to carry out the hybridization of the detection circuit on the read circuit, wettability surfaces are implanted on the front of the detection circuit and the front of the read circuit respectively, facing one another to promote the bonding of the microbumps of indium 8 providing the hybridization.

The interconnection substrate or array 1 on which the various modules thus produced are implanted, advantageously has a thermal expansion coefficient over the operating range of 80K-400/450K very close to that of germanium constituting the stress substrate bonded to the thinned silicon of the read circuit. This interconnection substrate is also advantageously produced from germanium. In fact, apart from the fact that no bimetal effect is observed between the read circuit and the interconnection substrate, the use of germanium is compatible with the treatment on silicon foundry lines, in particular for the metallic deposits and photolithography operations required for obtaining indexation patterns for ensuring the accurate positioning of the various elementary modules on said interconnection substrate. It is recalled that 80K is the operating temperature of the detector, and 400K the temperature suitable for the bonding.

Figure 4:
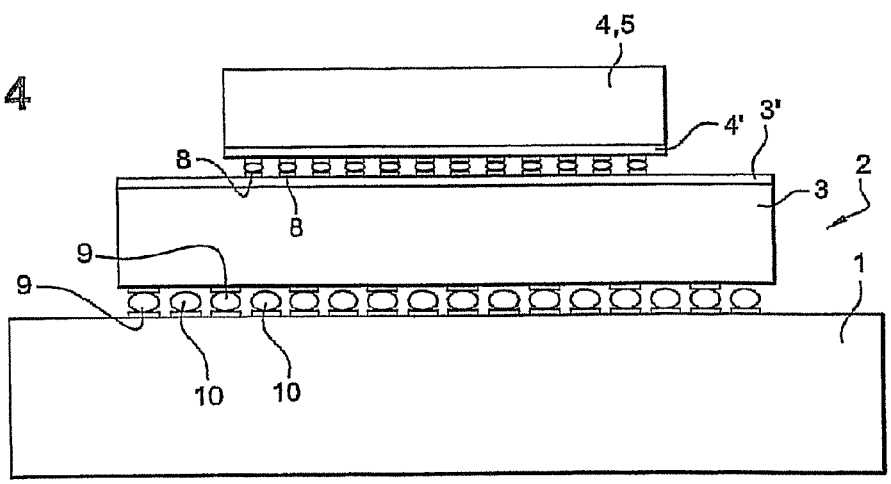
FIG. 4 is a schematic representation of a section of the hybridization of an elementary module according to the invention, before repair or replacement.
Figure 6:
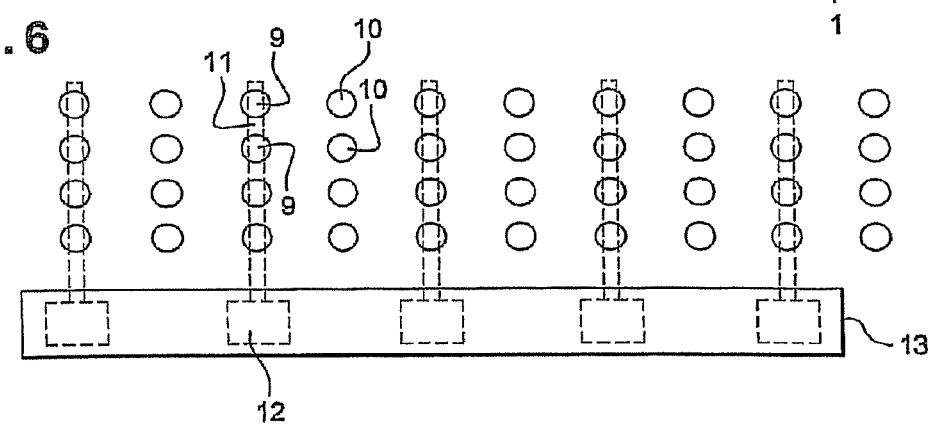
FIG. 6 is a plan view of the implantation of the hybridization bumps according to a particular embodiment of the invention.

According to one feature of the invention, as seen in FIG. 4, and as may be observed in FIG. 6, not one but two arrays (or even three) of quantities of material intended to act as hybridization bumps are implanted on the interconnection substrate 1.

According to one feature of the invention, and as may be observed in FIG. 6, not one but two arrays (or even three) of quantities of material intended to act as hybridization bumps are implanted on the interconnection substrate 1.

The first array 9, made from indium, is connected via conducting metal tracks 11 to the exterior of the module implant zone at the external interconnection pins 12. These pins are typically made from gold, and are isolated by masking particularly using a photoresist or an insulating layer, for example made from ZnS during the hybridization operation of the elementary modules.

As a corollary, a second array 10 of quantities of hybridization material of the same type as the array 9 is deposited, for example alternating with said first array. This second array is also made from indium, but on the other hand, it is not connected to the external connection pins because this second array constitutes the last array usable for hybridization.

In the particular case of the implant of three arrays (not shown), a case offering two possibilities of repair, only the first two arrays are connected to external pins by conducting metal tracks distinct from the conducting tracks 11.

Figure 5:
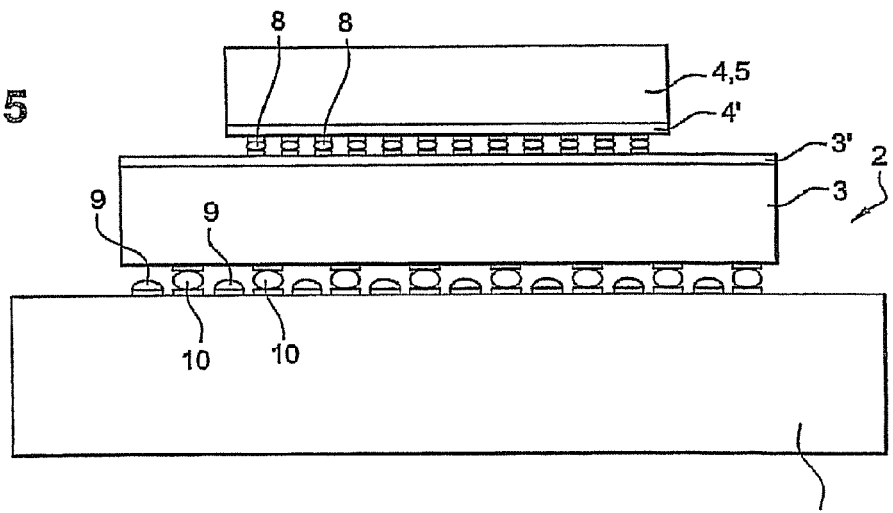
FIG. 5 is a similar view to FIG. 4, after replacement.

According to another feature of the invention, as seen in FIG. 5, the volume of hybridization material deposited for said second array 10 is smaller than that of said first array 9, because the objective, during the hybridization of the elementary module 2 on the interconnection substrate 1 is to prevent said second array from being in contact with said module and being affected by this hybridization called "nominal."

The nominal hybridization of the elementary module or modules on the interconnection substrate occurs conventionally by raising the temperature of the chamber in which all these various elements are positioned, to a temperature at least equal to the melting point of the hybridization material, to ensure the effective hybridization by reflow effect.

Prior to these operations, a flux of material in liquid form called soldering flux is deposited on the interconnection substrate. Conventionally, this soldering flux is first intended to ensure the deoxidation of the hybridization material and to limit its reoxidation during the actual soldering operation, that is occurs during the reflow operation.

This flux also performs the function of heat transfer, and also reduces surface tension levels, thereby enabling said material to substantially adopt the shape of a roughly circular bump, hence the term hybridization bumps.

In normal operation, that is in the case in which none of the elementary modules is defective, either due to a degradation of mechanical origin or other, or due to its manufacturing process, the second array 10 does not perform any function.

On the other hand, in case of degradation of one of these elementary modules during operation, or even during hybridization, it is advisable to be able to replace the module in question, and it is for this purpose that the second array 10 will become operational.

For this purpose, the protective layer 13 is first removed from the external connection pins 12 connected to the first array 9 of nominal hybridization bumps in the defective module.

Then, an electricity conducting solution, and for example a hybridization flux, is caused to migrate by capillarity in the corresponding connection zone, that is between said defective module and the interconnection substrate, this migration being located at the defective module alone. The migration of said flux can easily be reduced to the defective module alone by selecting a reduced input (microdeposition by syringe) coupled with migration by capillarity. At all events, any surplus deposit would have no effect on the other bumps because the transfer of material (indium consumption) only concerns the bumps electrically coupled with the external connection pin.

Due to the conducting nature of this flux on the one hand, and the difference in normal redox potentials of the indium (−0.33 volts) constituting the hybridization material, and the gold (+0.99 volts) constituting the external connection pins on the other, respectively, an electrochemical reaction or cell effect occurs, with the consequence of the consumption of the hybridization bumps of said first array 9 subject to this difference in redox potential. Moreover, a selection is made of the bumps to be eliminated, and in any case sharply reduced via the external connection pins 12. The electrical looping provided by the conducting solution leads to an immediate transfer of material. In the presence of gold and indium, the movement of the indium toward the gold leads to the complete disappearance of the indium bump (not including, or in the intermetallic compound).

Thus, due to the fact that the second array 10 of hybridization bumps is not connected to the external connection pins 12, the array is not affected by the corrosive reactions resulting from this electrochemical reaction. Only the first array 9 is thus consumed, totally or partially, according to the time during which this interconnection zone is subjected to the introduced flux.

In doing so, it becomes possible after a certain reaction time, typically a few seconds, to remove the defective elementary module, which is then no longer mechanically connected to said interconnection substrate 1.

Advantageously, this is followed by a phase of cleaning the zone of the interconnection substrate thus exposed. In the particular case of the use of a hybridization flux, complete removal generally requires a rinsing with a pure flux followed by a sprinkling of deionized water (for example using a high pressure jet) followed by drying under nitrogen gas.

The installation of the replacement elementary module 2' then takes place as follows. A new layer of hybridization flux is redeposited on the zone concerned of the interconnection substrate and in particular on the bumps constituting the second array 10. Blowing is provided to limit the quantity of flux. This blowing can be oriented outward from the interconnection network in order to channel the removal of the surplus.

The presence of any traces of flux opposite the other modules would have no effect on the behavior of these modules. The overall focal plane is again cleaned after repair to remove any residual flux.

The replacement elementary module 2' is then positioned in the place of the replaced module, and a hybridization phase is carried out as previously described.

According to an alternative of the invention, instead of depositing the hybridization flux on the interconnection substrate, said flux can be deposited on the back of the replacement elementary module.

It is clear that due to the smaller quantity of hybridization material constituting the second array 10, the dimension along the Z axis of the photosites of said replacement module 2' does not correspond to the original dimension of the replaced module 2, the difference in volume of the bumps of said array 10 resulting in a lower height $h$ of the corresponding bumps. $\Delta h$ indicates this variation in height in FIG. 8, this variation may be as high as a few microns. This defocusing of the photosites concerned is detrimental to the quality of the corresponding detection matrix.

In order to contend with this dimensional variation, an elementary module is accordingly selected of which the detection circuit 4 (or the read circuit) has a greater thickness, thereby to recover the original dimension along the Z axis.

It is accordingly clear that a defective elementary module in a focal plane comprising a plurality of such modules juxtaposed or joined end to end can easily be replaced by the method of the invention.

The present invention has been described using the combination HgCdTe/CdTe/Ge, in which the active layer has been deposited by molecular jet epitaxy on a germanium substrate.

However, it can also be implemented with a detection function provided by quantum wells produced by epitaxy on AsGa substrates, or even with a detection circuit consisting of a monolithic InSb substrate, or even using silicon as a detection material, for the visible spectral range.

The invention claimed is:

1. A method for producing a matrix of electromagnetic radiation detectors, consisting of a plurality of elementary detection modules mounted on an interconnection substrate, said elementary modules themselves comprising at least one circuit for detecting said radiation associated with a hybridization read circuit, said read circuit being joined to the interconnection substrate by hybridization, comprising the steps of:
    depositing on the interconnection substrate a predefined number of quantities of solder or hybridization material, intended to constitute the hybridization bumps with the elementary modules, and in at least two arrays, respectively a first array for the nominal hybridization, and at least one second array, at least said first array for nominal hybridization being connected to interconnection pins via conducting metal tracks, the deposits of solder or hybridization material of said second array or arrays being lower in volume than those of said first array;
    depositing a soldering material on the interconnection substrate provided with these at least two arrays, a flux of material in liquid form performing the functions of deoxidation of said solder or hybridization material, of limiting the reoxidation of said material after effective completion of said soldering, of heat transfer, in addition to decreasing the surface tension;
    mounting the elementary modules to be hybridized on the interconnection substrate; and
    then raising the temperature of a chamber in which the various elements to be hybridized are positioned until reaching at least the melting point of the solder or hybridization material in order to complete the effective soldering or hybridization of the elementary modules to the interconnection substrate together by reflow effect of said first array of hybridization bumps.

2. The method for producing a matrix of electromagnetic radiation detectors as claimed in claim 1, wherein the soldering material of said first and second arrays are of the same type.

3. A method to provide for replacing an elementary detection module mounted by hybridization on an interconnection substrate comprising a plurality of such elementary modules juxtaposed or joined together side by side in order to define a large focal plane, said elementary modules being mounted on the interconnection substrate by a first array of hybridization bumps, said bumps being connected to one or more external connection pins by one or more conducting tracks, the interconnection substrate also comprising at least one second array of hybridization bumps, the dimensions of the bumps of said at least second array being lower than those constituting said first hybridization array, comprising the steps of:
    removing a protective layer applied to the external connection pin or pins electrically connected to said first array of hybridization bumps;
    then causing to migrate, in particular by capillarity, an electrically conducting solution between said elementary module to be replaced and the interconnection substrate, in order to cause, by electrochemical reaction, the at least partial dissolution of said first array of hybridization bumps;
    removing said elementary module to be replaced;
    mounting a replacement module to be hybridized on the interconnection substrate in place of said removed elementary module; and
    then hybridizing the replacement module by a new temperature rise of a chamber in which the assembly is located to a temperature at least equal to the melting point of the material constituting said hybridization bumps of the second array, to join them by a reflow effect of said second array of hybridization bumps.

4. The method as claimed in claim 3, wherein the materials for soldering said first and second arrays are of the same type.

5. The method as claimed in claim 3, wherein the replacement module comprises a detection circuit or a read circuit that is thicker than the detection circuit or the read circuit of the replaced module, in order to compensate for the variation in height of the hybridization bumps between the two arrays.

6. The method as claimed in claim 3, wherein the electrically conducting solution is deposited on the back of the elementary module to be replaced.

* * * * *